United States Patent
Tran et al.

(10) Patent No.: US 7,186,651 B2
(45) Date of Patent: Mar. 6, 2007

(54) CHEMICAL MECHANICAL POLISHING METHOD AND APPARATUS

(75) Inventors: Joe G. Tran, Flower Mound, TX (US); Chad J. Kaneshige, McKinney, TX (US); Brian K. Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 226 days.

(21) Appl. No.: 10/697,676

(22) Filed: Oct. 30, 2003

(65) Prior Publication Data

US 2005/0095863 A1    May 5, 2005

(51) Int. Cl.
    *H01L 21/302* (2006.01)
(52) U.S. Cl. .................... 438/692; 156/345.1
(58) Field of Classification Search .......... 438/692; 156/345.12, 345.1
    See application file for complete search history.

(56) References Cited

U.S. PATENT DOCUMENTS

| | | | |
|---|---|---|---|
| 4,728,552 A | 3/1988 | Jensen, Jr. .................... 428/91 |
| 4,841,680 A | 6/1989 | Hoffstein et al. .............. 451/42 |
| 4,927,432 A | 5/1990 | Budinger et al. ............. 51/298 |
| 5,177,908 A | 1/1993 | Tuttle .......................... 51/283 |
| 5,257,478 A | 11/1993 | Hyde et al. .................. 451/287 |
| 5,394,655 A | 3/1995 | Allen et al. .................... 451/63 |
| 5,489,233 A | 2/1996 | Cook et al. .................... 451/41 |
| 5,578,362 A | 11/1996 | Reinhardt et al. .......... 428/147 |
| 5,605,760 A | 2/1997 | Roberts .................... 428/409 |
| 5,900,164 A | 5/1999 | Budinger et al. ............. 216/88 |
| 6,736,709 B1 | 5/2004 | James et al. ................. 451/287 |
| 6,824,455 B2 | 11/2004 | Osterheld et al. ........... 451/286 |
| 6,863,774 B2 * | 3/2005 | Cooper et al. .............. 162/100 |
| 6,910,947 B2 * | 6/2005 | Paik ............................ 451/21 |
| 2005/0095863 A1 | 5/2005 | Tran et al. ..................... 21/302 |

* cited by examiner

*Primary Examiner*—Nadine G. Norton
*Assistant Examiner*—Lynette T. Umez-Eronini
(74) *Attorney, Agent, or Firm*—Yingsheng Tung; Wade James Brady, III; Frederick J. Telecky, Jr.

(57) ABSTRACT

A method for removing material from the surface of a semiconductor wafer with a chemical mechanical polishing process is described. The method uses a polishing pad on which a line-pattern of grooves is formed. The pattern comprises orderly spaced grooved-area and area without grooves. The method combines information of the surface topography of the wafer, the nature of the material to be removed, and the available groove pattern on the surface of the polishing pad to generate a process recipe in which the resident time of portions of the semiconductor wafer spends at the grooved and un-grooved areas of the polishing pad during the chemical mechanical polishing process is predetermined.

11 Claims, 2 Drawing Sheets

CHEMICAL MECHANICAL POLISHING METHOD AND APPARATUS

BACKGROUND OF THE INVENTION

This invention relates to semiconductor processing, particularly to a chemical mechanical polishing method and apparatus with which to achieve superior global and local wafer planarity control.

Modern integrated-circuit technology is capable of packing a large number of circuit-components at near the surface of a semiconductor wafer by scaling down the feature size of the circuit-components and connects the components with a large number of metal lines imbedded in a matrix of multiple layers of metal and dielectric material. Beneath the silicon wafer surface, the circuit-elements are isolated from each other by regions of silicon dioxide in shallow trenches to prevent unwanted electrical current passage between the circuit-elements.

Because of the downward scaling of the feature size and the increasing complexity of interconnecting scheme, the wafer process requires a high degree of wafer surface planarization. Specifically, the wafer surface must be planarized locally as well as globally after the formation of the shallow trenches and at all interconnect levels. Currently the technique of chemical mechanical polishing is the only satisfactory technique with which the necessary degree of planarization can be achieved.

In a chemical mechanical polishing operation, a semiconductor wafer is mounted upside down on a wafer-carrier, and the carrier is pressed downward against a polishing pad, which is motion with respect to the rotating wafer-carrier. Slurry comprised of silica or cerium oxide particles, for example, suspended in alkaline to slightly acid solution drips onto the polishing pad that has flow channels machined to transport the slurry beneath the rotating wafer carrier where it polishes the wafer surface.

The most popular type of chemical mechanical polisher is the rotary polisher in which both a platen and the wafer-carrier rotate. The carrier holds the wafer face down, and applies a downward force against the surface of the pad. The pad is mounted on a rotating platen by waterproof adhesive. The wafer-carrier rotates about the center point of the wafer and it oscillates along a radius of the platen such that the entire wafer surface contacts the polishing pad during the polishing operation.

Some types of the polishing pads are made of materials that absorb the slurry; other types are made of materials that do not have the ability to absorb the slurry.

The rate of removal of the target material is a function of the pressure that the pad exerts on the wafer surface, the relative speed between the pad and the wafer surface, and the nature of the slurry.

DESCRIPTION OF THE PREFERRED EMBODIMENT

The applicants recognize that with today's rotary chemical mechanical polisher, different portions of the wafer experience different relative speed with respect to the polishing pad during the polishing operation. The applicants also recognize that different processes that deposit the target material on the wafer surface may effects different built-in non-planarity on the wafer surface. In certain instances, the target material coating on the wafer may be thicker at the center while in other instances the coating is thicker at the edges.

The applicants further recognize that the rate of removing the target material depends on the presence of the slurry at the point where the wafer contacts the polishing pad. With a polishing pad made of material such as polyurethane, polycarbonate, nylon, acrylic polymer, or polyester, the slurry is transported to the contact point by the flow channels machined onto the polishing pad. Therefore, the rate of target material removal is a function of the dimension and density of the flow channels—a wafer gliding over an area on the polishing pad that has more densely placed flow channels will have more of the target material removed than over an area that has more sparsely placed flow channels.

Therefore, the applicants discovered that with a properly designed flow-channel pattern, desired planarity can be achieved even when the surface topography of the target material as formed is highly non-planar. The following exemplary embodiments are for the purpose of describing this invention.

Figure 1:
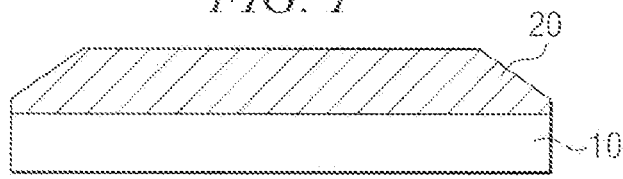
FIG. 1 depicts a cross section of a semiconductor wafer.

FIG. 1 depicts the cross-section view of a silicon wafer 10 with a deposited layer of silicon dioxide 20. The dioxide layer may be formed following the formation of shallow trench isolation.

In FIG. 1, the silicon dioxide layer 20 is outwardly tapered—its thickness at the center of the wafer is greater than at the edge of the wafer. In order to compensate for this outward-tapering, it is advantageous to use a polishing pad that has a pattern of flow channels as depicted in FIG. 2.

Figure 2:
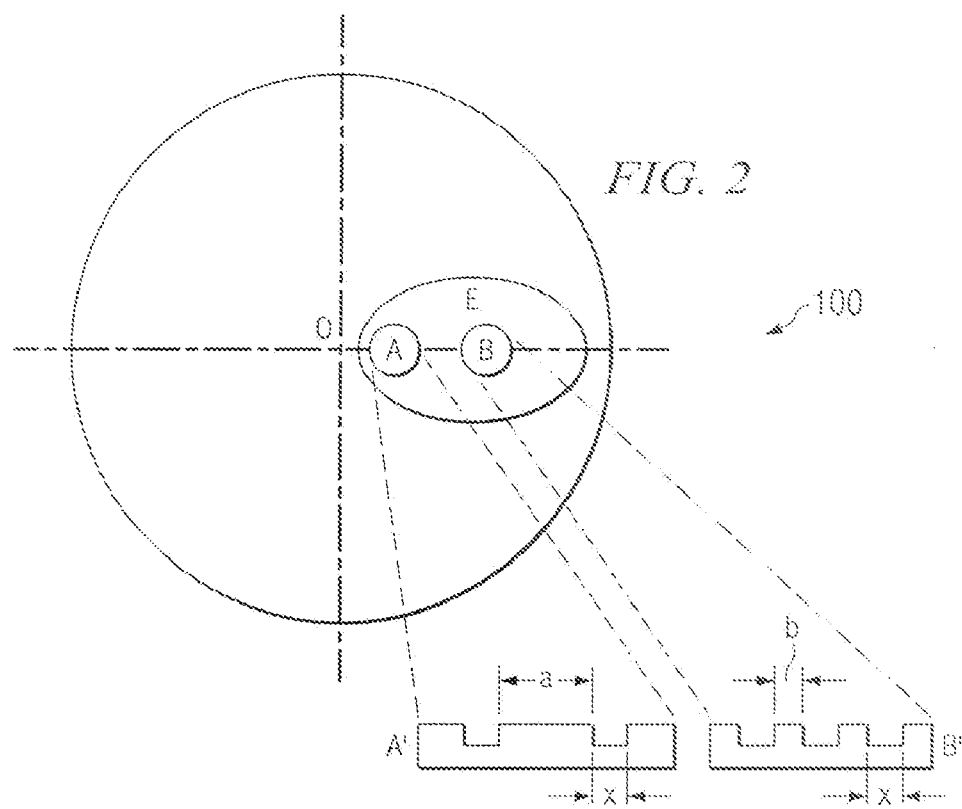
FIG. 2 depicts a polishing pad with a flow-channel pattern of the present invention.

FIG. 2 depicts a polishing pad 100, which may be made of material such as polyurethane. FIG. 2 also depicts two areas A and B of the polishing pad and the enlargements A' and B' of the two areas, and the flow channels in the areas. Note that the spacing between the flow channels in area A is 'a' and the spacing between the flow channels in area B is 'b'. To polish an outwardly tapered wafer, the more favorable flow-channel pattern for polishing pad should be such that 'a' is wider than 'b'—in some cases, area A may be free of any flow-channels. It is applicants' observation that during the polishing operation, the wafer and the wafer carrier oscillates along a line OP while rotating. As a result, the edge of the wafer travels along the edge of an ellipse E while the center portion of the wafer is confined in the interior of the ellipse E. A flow channel pattern such as depicted in FIG. 2 will achieve a polishing rate lower at the edge of the wafer because of the more sparsely spaced flow channels at the location A.

Figure 3:
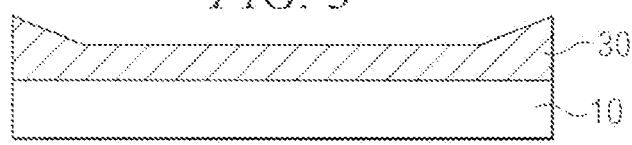
FIG. 3 depicts a cross section of another semiconductor wafer.

FIG. 3 depicts the cross-section view of another silicon wafer 30 with a layer 40 coated on the top surface. In this case, the layer 40 is inwardly tapered so that it is thinner at the center than at the edge of the wafer. Layer 30 may be deposited on the silicon with a spin-on process. In order to compensate for inward-tapering, it is advantageous to use a polishing pad that has a pattern of flow channels as depicted in FIG. 4.

Figure 4:
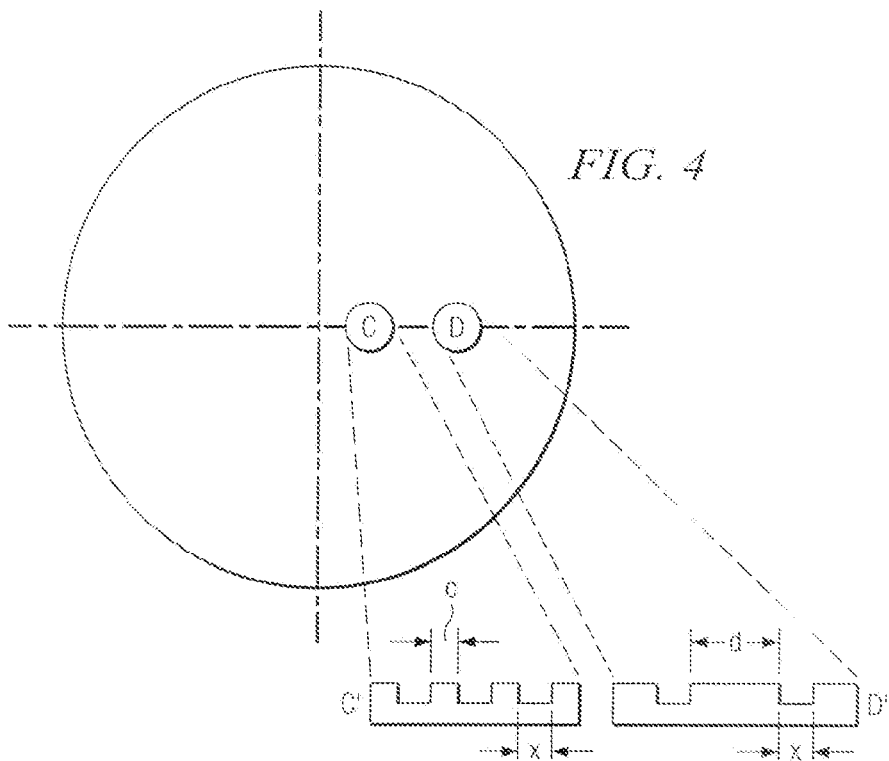
FIG. 4 depicts another polishing pad with a flow-channel pattern of the present invention.

FIG. 4 depicts another polishing pad and two areas C and D on the polishing pad. Also depicted in FIG. 4 are the enlargements C' and D' of the two areas and the flow channels in the areas. The spacing between the flow channels in area C is 'c' and the spacing between the flow-channels in area D is 'd'. To polish a inwardly-tapering wafer, the more favorable flow-channel pattern should be such that 'd' is wider than 'c'—in some cases D may be free of any flow-channels. A polishing pad having a flow-channel pattern as depicted in FIG. 4 removes the target material more slowly at the center of the wafer because of the more sparsely spaced flow-channels.

Figure 5:
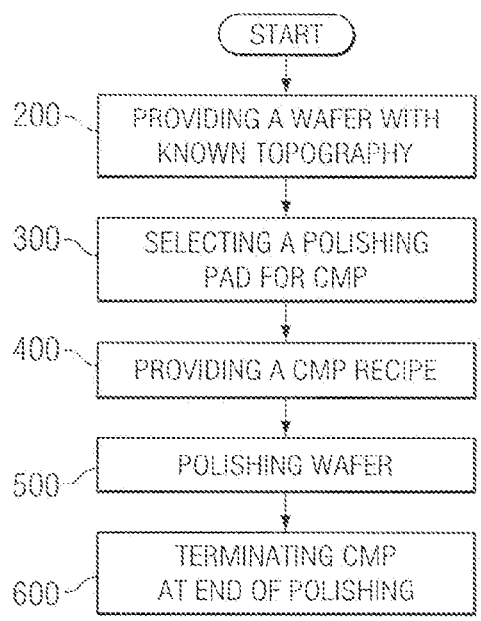
FIG. 5 depicts a flowchart of a chemical mechanical polishing process of the present invention.

FIG. 5 is a flowchart for a chemical mechanical polishing process of the present invention. The process starts by providing a wafer having a coating of target material with a known surface topography to be polished 200. This topography may be ascertained by scanning the top surface of each wafer or by sample-scanning a representative wafer in a wafer-lot. As explained earlier, the topography of the coating is generally a function of how the coating is formed and the nature of the coating material. In case of a spin-on film such as a spin-on-glass, the film tends to be inwardly tapered as the spun-on material gets pushed outwardly by the centrifugal force of spinning operation to the edge of the wafer. In case of electro-plating, the location of the electrode and the current path in the wafer surface may cause the film to be outwardly tapered.

The next step is to select a polishing pad of a proper flow-channel pattern 300. As explained in the previous paragraphs, for a given relative polishing speed, an area of denser flow-channel usually removes target material at a higher rate.

The next step is to provide a recipe for the CMP operation 400. The recipe may include the rotational speed for the platen—polishing pad and the rotational speed for the wafer-carrier, the frequency of the wafer carrier oscillating along a radius of the platen, the slurry feeding rate, and endpoint detection data or a predetermined polishing time.

The next step is the actual polishing 500 of the wafer according to the recipe 400. When the predetermined polishing time is reached or when the endpoint detection mechanism triggers, the CMP operation is terminated 600.

The present invention may be applied to semiconductor wafer other than silicon. For example, the CMP method is applicable on compound semiconductor material. It is applicable on SiGe material. The target film may comprise other material such as silicon, tungsten or copper. The flow-channel may be of more than one width and one depth.

What is claimed is:

1. A method for removing material from a surface of a semiconductor wafer with a chemical mechanical polishing (CMP) process, comprising:
   a. providing a semiconductor wafer having a top surface and a substantially flat bottom surface, the top surface substantially parallel the bottom surface;
   b. providing a CMP apparatus including a polishing pad, the polishing pad having a polishing surface and a backing surface, the backing surface attaching to a platen, the polishing surface having a patterned portion and a un-patterned portion, the patterned portion having regularly spaced flow channels formed therein, the un-patterned portion free of flow channels;
   c. providing a process recipe for polishing a semiconductor wafer based on a topographic information of the top surface, the recipe including directing a portion of the semiconductor wafer to reside in the channel-free portion of the polishing pad during a portion of the process;
   e. commencing the CMP process based on the process recipe; and
   f. terminating the CMP process when a predetermined amount of material is removed from the top surface of the semiconductor wafer.

2. The method of claim 1, in which the flow channels in the patterned portion form concentric rings uniformly spaced radially.

3. The method of claim 1, in which the flow channels in the patterned portion form concentric rings spaced increasingly densely from a central portion of the polishing surface outwardly to a peripheral portion of the polishing surface.

4. The method of claim 1, in which the patterned portion having concentric rings spaced decreasingly densely from a intermediate portion of the polishing surface towards a central portion and a peripheral portion of the polishing surface.

5. The method of claim 1, in which the un-patterned portion of the polishing surface forms an arc.

6. The method of claim 5, in which the polishing surface comprises a plurality of the circular bands.

7. The method of claim 6, in which the concentration of the plurality of the circular bands is higher in the middle portion of the polishing surface than in the central and the peripheral portions of the polishing surface.

8. The method of claim 6, in which the concentration of the plurality of the circular bands is lower in the middle portion of the polishing surface than in the central and the peripheral portions of the polishing surface.

9. The method of claim 1, in which the flow channel is one continuous spiral.

10. The method of claim 9, in which the lines of the spiral are spaced more sparsely at the center of the polishing pad.

11. The method of claim 9, in which the lines of the spiral are spaced more sparsely at the midpoint between the center and the edge of the polishing pad.

* * * * *